(12) United States Patent
Yen et al.

(10) Patent No.: US 9,385,246 B2
(45) Date of Patent: Jul. 5, 2016

(54) DIFFERENTIAL MOSCAP DEVICE

(71) Applicant: TAIWAN SEMICONDUCTOR MANUFACTURING CO., LTD., Hsin-Chu (TW)

(72) Inventors: Hsiao-Tsung Yen, Tainan (TW); Yu-Ling Lin, Taipei (TW); Chin-Wei Kuo, Zhubei (TW); Min-Chie Jeng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/594,201

(22) Filed: Jan. 12, 2015

(65) Prior Publication Data

US 2015/0123244 A1 May 7, 2015

Related U.S. Application Data

(62) Division of application No. 13/660,172, filed on Oct. 25, 2012, now abandoned.

(51) Int. Cl.
| | | |
|---|---|---|
| *H01L 29/94* | (2006.01) | |
| *H01L 23/522* | (2006.01) | |
| *H01L 49/02* | (2006.01) | |

(52) U.S. Cl.
CPC ............ *H01L 29/94* (2013.01); *H01L 23/5223* (2013.01); *H01L 28/60* (2013.01); *H01L 2924/0002* (2013.01)

(58) Field of Classification Search
CPC ..... H01L 29/94; H01L 23/5223; H01L 28/60; H01L 2924/0002; H01L 28/40; H01L 29/98; H01L 27/0805; H01L 27/0808
See application file for complete search history.

(56) References Cited

U.S. PATENT DOCUMENTS

| | | | |
|---|---|---|---|
| 7,151,287 B1 | 12/2006 | Scheffer et al. | |
| 2003/0114131 A1* | 6/2003 | Cornett | H01L 29/42384 455/326 |
| 2003/0151092 A1 | 8/2003 | Chien | |
| 2004/0201052 A1 | 10/2004 | Nakashiba | |
| 2007/0075350 A1 | 4/2007 | Darabi et al. | |
| 2007/0132069 A1 | 6/2007 | Lee | |
| 2009/0289329 A1* | 11/2009 | Pawlikiewicz | H01L 29/66174 257/596 |
| 2011/0175152 A1 | 7/2011 | Booth, Jr. et al. | |
| 2011/0204969 A1* | 8/2011 | Chen | H01L 29/7391 327/581 |
| 2012/0081180 A1* | 4/2012 | Lee | G06F 17/5068 330/257 |
| 2013/0228894 A1 | 9/2013 | Yen et al. | |
| 2013/0256826 A1 | 10/2013 | Gambino et al. | |

OTHER PUBLICATIONS

Official Action issued Dec. 26, 2013 in counterpart KR Patent Application No. 10-2012-0149657.

* cited by examiner

*Primary Examiner* — Galina Yushina
(74) *Attorney, Agent, or Firm* — Duane Morris LLP

(57) ABSTRACT

A differential MOS capacitor includes a first plurality of upper capacitor plates, a second plurality of upper capacitor plates, and a conductive plate. At least two of the second plurality of upper capacitor plates are spaced laterally from each other and are disposed laterally between at least two of the first plurality of upper capacitor plates. The conductive plate is configured to serve as a common bottom capacitor plate such that a first capacitor is formed by the first plurality of upper capacitor plates and the conductive plate and a second capacitor is formed by the second plurality of upper capacitor plates and the conductive plate.

13 Claims, 4 Drawing Sheets

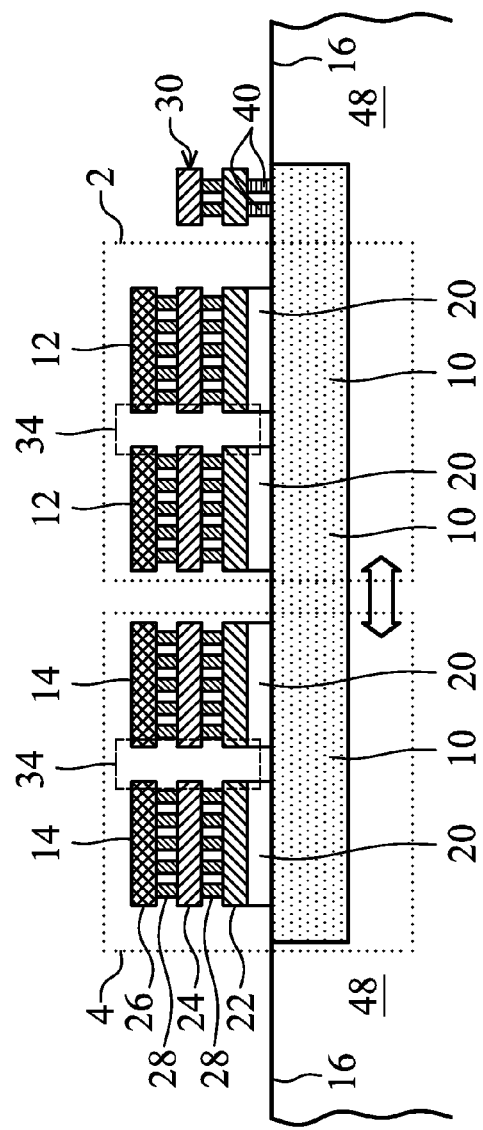
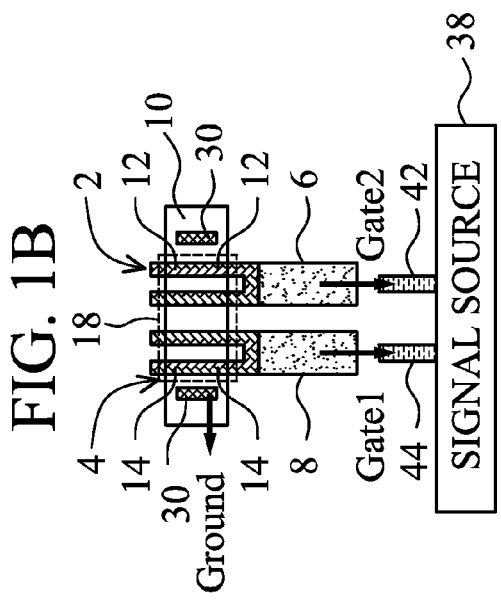
FIG. 1B
FIG. 1A

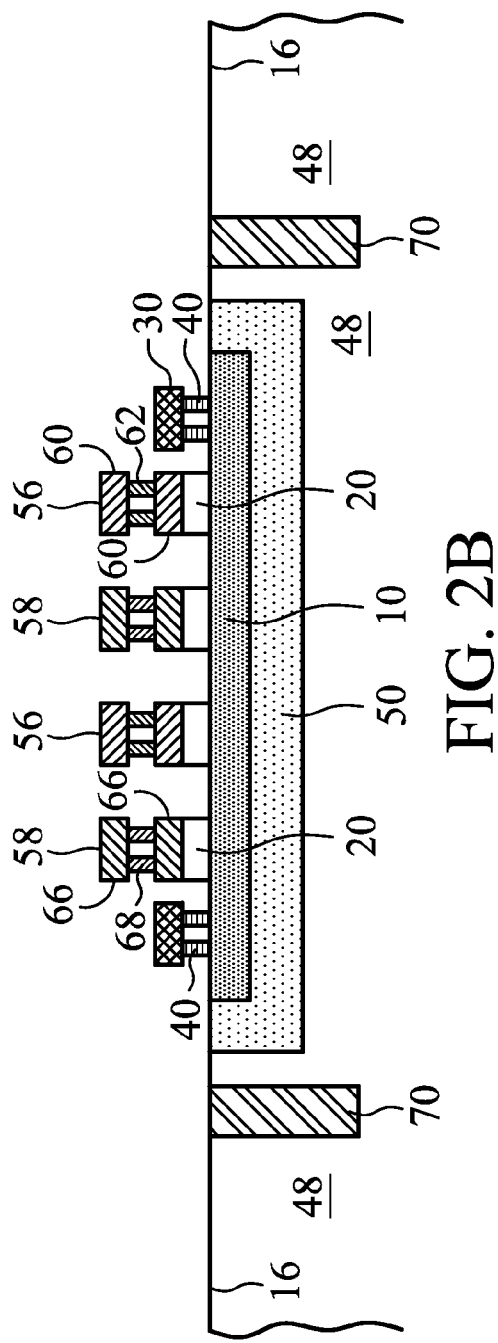
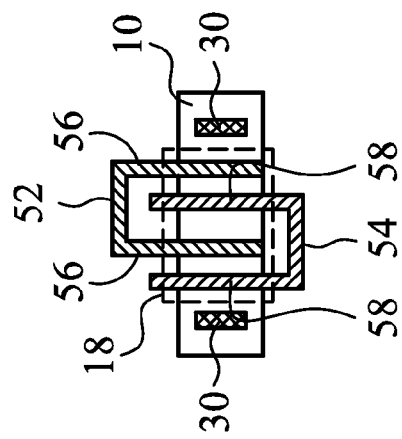

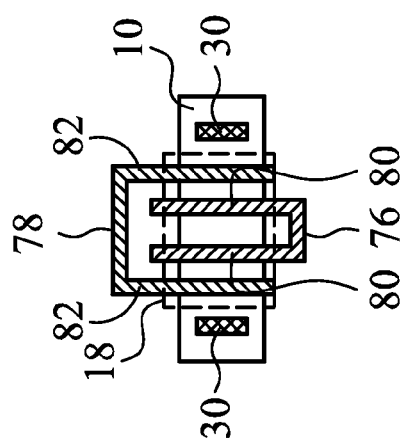
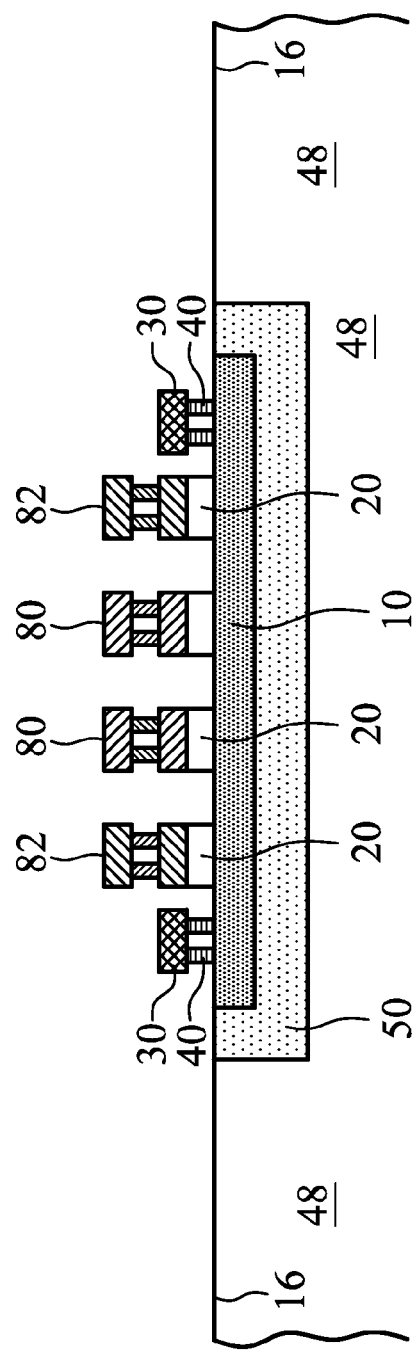
FIG. 3B
FIG. 3A

DIFFERENTIAL MOSCAP DEVICE

CROSS-REFERENCE TO RELATED APPLICATIONS

This application is a division of U.S. patent application Ser. No. 13/660,172, filed Oct. 25, 2012, the entirety of which is incorporated by reference herein.

TECHNICAL FIELD

The disclosure relates to differential MOS capacitor devices and methods for forming the same.

BACKGROUND

Differential capacitor devices such as differential MOSCAP devices are widely used in various applications and in various devices in the electronics industry. These semiconductor devices are fabricated using MOS, metal oxide semiconductor, manufacturing techniques, materials and principles. Differential capacitor devices include multiple capacitor sections or multiple capacitor plates or regions, and the different capacitor sections or different capacitor plates or regions can include different capacitances. Capacitance can be increased in one capacitor section of the MOS capacitor and decreased in another capacitor section of the MOS capacitor during operation, for example. Variable capacitances can be applied and the MOS capacitor devices therefore also serve as MOSVAR devices, i.e. MOS devices with variable reactance, i.e. variable capacitance.

MOSCAP devices are formed on or over semiconductor substrates using MOS processing operations. One problem that plagues differential capacitors is parasitic capacitance. Parasitic capacitance is present between electronic components or parts because of their proximity to each other. Parasitic capacitance can result between different capacitor electrodes coupled to different gates. Parasitic capacitance can also result between a capacitor electrode and the drain/source pickup devices used to couple various components such as a lower capacitor plate, to ground. Parasitic capacitance can alter the intrinsic capacitance of a capacitor and can also adversely affect the effective capacitance of the operating capacitor of the differential capacitor device. Parasitic capacitance negatively affects device speed and device performance.

It would therefore be desirable to provide methods and designs for differential MOS capacitor devices that eliminate or prevent parasitic capacitance.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIG. 1A is a top, plan view of an arrangement of a differential capacitor according to the disclosure and FIG. 1B is a cross-sectional view of a portion of the differential MOS capacitor of FIG. 1A;

FIGS. 2A and 2B are a plan view and a cross-sectional view of another embodiment of a differential MOS capacitor according to the disclosure;

FIGS. 3A and 3B are a plan view and a cross-sectional view of another embodiment of a differential MOS capacitor according to the disclosure;

DETAILED DESCRIPTION

Figure 5:
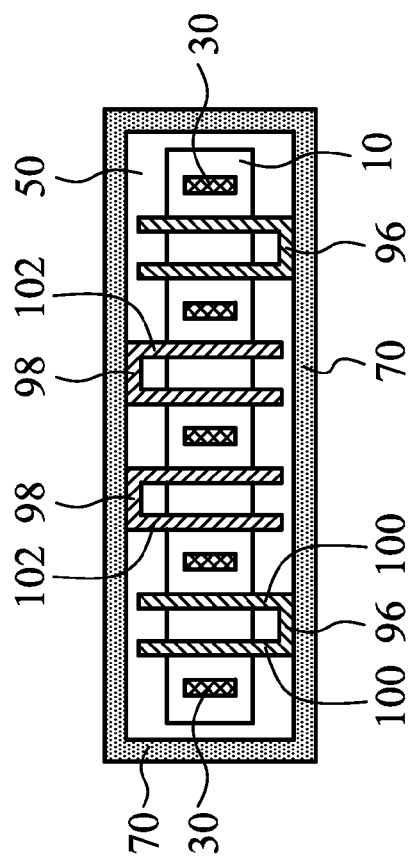
FIG. 5 is a plan, top view of another embodiment of a differential MOS capacitor according to the disclosure.

The disclosure provides a differential MOS capacitor (MOSCAP) with capacitor plates coupled to different gates. The gates can be biased differently. Different signals can be delivered to the gates and in one embodiment, out-of-phase signals are delivered to the gates. The differential MOSCAP includes multiple upper capacitor electrodes disposed over a common lower capacitor electrode which serves as a common node. In some embodiments, the common lower capacitor electrode is a conductive plate such as an N-well formed in a semiconductor substrate. The upper capacitor electrodes are formed over the common lower capacitor electrode in a capacitor region and, in some embodiments, no other electrical components are disposed in the capacitor region and no electrical connections are made to the capacitor region. In some embodiments, the MOSCAP device includes two capacitors or two capacitor sections coupled to two separate gates, with each of the capacitors or capacitor sections including multiple upper capacitor electrodes. In some embodiments, the multiple upper capacitor electrodes of each capacitor gate are adjacent one another, and in some embodiments, the multiple upper capacitor electrodes of both capacitors are disposed adjacent one another. In some embodiments, a guard ring is used and at least partially surrounds the lower conductive plate. In some embodiments, one or more drain/source pickup devices are used to couple the conductive plate serving as a common lower capacitor electrode, to ground.

FIGS. 1A and 1B show an exemplary arrangement of a differential MOS capacitor according to the disclosure. The differential MOS capacitor includes capacitors 2 and 4 coupled to gates 6 and 8, respectively. Each of capacitor 2 and capacitor 4 may be alternatively referred to and considered to be a capacitor section of a differential MOS capacitor but will be referred to as capacitors 2 and 4 throughout the disclosure. Capacitor 2 includes two upper capacitor plates 12 and capacitor 4 includes two upper capacitor plates 14. Upper capacitor plates 12 and 14 are electrodes that are disposed within capacitor region 18 which is indicated by dashed lines. Capacitor region 18 is rectangular in the illustrated embodiment and takes on other shapes in other embodiments. Capacitor region 18 can generally be described as a convex polygon as capacitor region 18 does not include void areas or indentations within the region. Upper capacitor plates 12 and 14 are disposed over lower capacitor plate 10. Lower capacitor plate 10 is a conductive structure, and in one embodiment, lower capacitor plate 10 is an N-well, or other active area or other conductive area formed within a semiconductor substrate such as within surface 16, which is an upper surface of semiconductor substrate 48. In other embodiments, lower capacitor plate 10 is formed of different materials and may be formed within surface 16 of semiconductor substrate 48 or over a semiconductor substrate such as semiconductor substrate 48. Capacitors 2 and 4 each include capacitor dielectric 20 disposed between lower capacitor plate 10 and each upper capacitor plate 12 and 14. Various oxides or other suitable dielectric materials are used for capacitor dielectric 20 and various dielectric thicknesses are used. Lower capacitor plate 10 represents a common node between the two upper capacitor plates 12, a common node between the two upper capacitor plates 14, and also a common node between upper capacitor plates 12 and 14, i.e. lower capacitor plate 10 is a common node for capacitors 2 and 4.

Upper capacitor plates 12 and 14 include different shapes and different structures in various embodiments. In the embodiment illustrated in FIG. 1A, each upper capacitor plate 12, 14 is formed of three semiconductive or conductive layers disposed over one another and coupled by vias. In one embodiment, each of lower conductive layer 22, middle conductive layer 24, and upper conductive layer 26 is a metal and in another embodiment, lower conductive layer 22 is formed of doped or undoped polysilicon, with middle conductive layer 24 and upper conductive layer 26 formed of metal. Vias 28 couple lower conductive layer 22 to middle conductive layer 24 and also couple middle conductive layer 24 to upper conductive layer 26. Other arrangements are used in other embodiments and in some embodiments, each upper capacitor plate 12, 14 is formed of fewer than three semiconductive or conductive layers shown in FIGS. 1A and 1B. Upper capacitor plates 12 and 14 are rectangular in FIG. 1A, but other shapes are used in other embodiments. Because lower capacitor plate 10 is a common node as indicated above, regions 34 are largely void of any parasitic capacitance between the respective upper capacitor plates 12 and between the upper capacitor plates 14. Because there are no further electrical components in regions 34, parasitic capacitance between upper capacitor plates 12, 14 and a further electrical component, is avoided. The components shown in FIGS. 1A and 1B are formed using various semiconductor manufacturing processes and materials in various embodiments.

In one embodiment, capacitors 2 and 4 serve as a differential MOS capacitor, with different signals delivered to respective capacitors 2 and 4. In one embodiment, gates 6 and 8 are coupled to signal source 38 as shown in FIG. 1A. Signal source 38 delivers AC signals in one embodiment. In one embodiment, signal 42 delivered to gate 6 and capacitor 2, is out of phase with signal 44 delivered to gate 8 and capacitor 4. In one embodiment, signals 42 and 44 are 180° out of phase. In one embodiment, signals 42 and 44 are sinusoidal signals that are delivered such that a voltage of +1V is delivered to one of gates 6, 8 at the same time a negative voltage of −1V is delivered to the other of gates 6, 8. Various amplitudes and frequencies are used in various embodiments. In some embodiments, signals 42 and 44 are delivered in phase. In some embodiments, signals 42, 44 delivered to gates 6 and 8 include the capacitance increasing in capacitor 2 while the capacitance decreases in capacitor 4, or vice versa. Although a single signal source 38 is shown in FIG. 1A, in other embodiments, two separate dedicated signal sources are used with a separate signal source dedicated to each gate 6, 8. Either or both of signals 42, 44 may be signals that vary in strength and frequency and capacitors 2 and 4 are varactors in various embodiments.

In some embodiments, such as will be shown in FIGS. 2A and 2B, a guard ring is used to at least partially surround lower capacitor plate 10. In other embodiments, such as shown in FIGS. 1A and 1B, one or more pickup devices 30 are used. Pickup devices 30 are drain/source pickup devices and are used to provide a direct connection between lower capacitor plate 10 and ground. In one embodiment, all pickup devices 30 are disposed outside capacitor region 18. In other embodiments, pickup devices 30 are situated such that they are not interposed between upper capacitor plates 12 and such that they are not interposed between upper capacitor plates 14. In still other embodiments, pickup devices are not used. Pickup devices 30 are directly coupled to lower capacitor plate 10 by contacts 40 and are formed of one or more layers of stacked conductive or semiconductor materials such as polysilicon and metal. Pickup devices 30 are coupled to ground using various wires and other conductive interconnect features not shown in FIGS. 1A and 1B.

FIGS. 2A, 2B show another arrangement of a differential MOS capacitor according to the disclosure. The differential MOS capacitor includes capacitors 52 and 54. In FIG. 2A, capacitor 52 includes two upper capacitor plates 56 and capacitor 54 includes two upper capacitor plates 58. Upper capacitor plates 56 and 58 are disposed within capacitor region 18. Upper capacitor plates 56 and 58 are arranged in an alternating matter and adjacent one another within capacitor region 18 and capacitor region 18 includes no other electrical components therein. In particular, capacitor region 18 includes no pickup devices 30 situated over and contacting lower capacitor plate 10. Two pickup devices 30 are disposed over and contacting lower capacitor plate 10 in regions outside capacitor region 18. Capacitors 52 and 54 are coupled to respective gates (not shown) and the gates are coupled to a signal source or multiple signal sources that provide separate signals to the respective gates as described above and therefore separate signals to capacitors 52, 54.

In the cross-sectional view of FIG. 2B, each upper capacitor plate 56, 58 includes only two conductive or semiconductive layers. Upper capacitor plates 56 include two conductive or semiconductive layers 60 coupled by vias 62 and upper capacitor plates 58 each include two conductive or semiconductive layers 66 coupled by vias 68. Conductive or semiconductive layers 60 may be the same as conductive or semiconductive layers 66. In other embodiments such as was shown in FIG. 1A, 1B, each upper capacitor plate is formed of three stacked conductive plates with interconnecting vias. FIGS. 2A and 2B show pickup devices 30 disposed on and directly coupled to lower capacitor plate 10 by contacts 40 and disposed outside capacitor region 18. In the illustrated embodiment of FIG. 2B, pickup device 30 is formed of only a single conductive layer which may be polysilicon or various suitable metals but pickup device 30 is formed of various levels of conductive materials in various embodiments. FIG. 2B also shows guard ring 70 formed within surface 16 of semiconductor substrate 48 and guard ring 70 completely or at least partially surrounds lower capacitor plate 10. Guard ring 70 is formed of vias and stacked metal layers in some embodiments. The depiction of both pickup device 30 and guard ring 70 in FIG. 2B represents one embodiment only and in other embodiments, only one of pickup device 30 and guard ring 70 is used and in still other embodiments, neither of pickup device 30 and guard ring 70 is used. In some embodiments, lower capacitor plate 10 is an N-well region. In some embodiments, lower capacitor plate 10 is a P-well formed within an N-well or deep N-well region 50 in semiconductor substrate 48. Lower capacitor plate 10 is formed of other materials in other embodiments.

FIGS. 3A and 3B illustrate another arrangement of a differential MOS capacitor according to the disclosure. FIGS. 3A and 3B show capacitors 76 and 78 that combine to form the differential MOS capacitor. Capacitor 76 includes upper capacitor plates 80 and capacitor 78 includes upper capacitors plates 82. Upper capacitor plates 80 and 82 are all within rectangular capacitor region 18. Capacitor region 18 does not include pickup devices 30 or any other electrical components therein. In the arrangements shown in FIGS. 3A, 3B, the upper capacitor plates 80 from capacitor 76 are immediately adjacent one another and internally adjacent upper capacitor plates 82 of capacitor 78. FIGS. 3A and 3B also show an embodiment in which the upper capacitor plates 80, 82 are disposed sequentially adjacent one another along a direction within capacitor region 18 (extending left to right in the illustrated embodiment) which includes no further electrical components therein.

Figure 4:
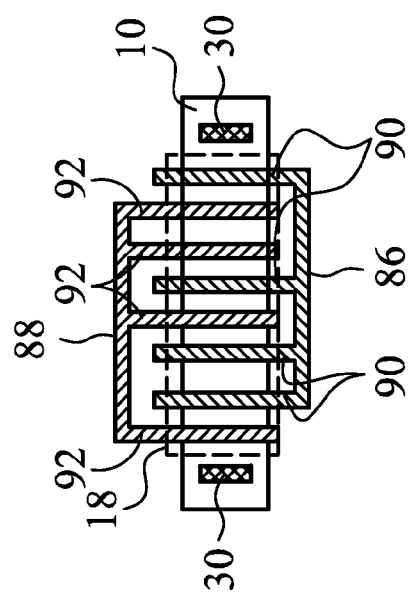
FIG. 4 is a plan, top view of another embodiment of a differential MOS capacitor according to the disclosure.

FIG. 4 shows another embodiment of a differential MOS capacitor according to the disclosure. In FIG. 4, capacitors 86, 88 each include more than two upper capacitor plates. As in the other embodiments, capacitors 86, 88 may alternatively be considered to represent respective capacitor sections of a differential MOS capacitor. Capacitor 86 includes four upper capacitor plates 90 and capacitor 88 includes four upper capacitor plates 92. Each capacitor 86, 88 is coupled to a gate and a signal source, not shown in FIG. 4. FIG. 4 also illustrates an embodiment in which upper capacitor plates 90, 92 are disposed sequentially adjacent one another within capacitor region 18 that includes no other electrical components therein. In particular, capacitor region 18 is void of pickup devices 30 which are, instead, disposed external to capacitor region 18. The arrangements shown in FIGS. 1A, 1B, 2A, 2B, 3A, 3B and FIG. 4 are examples of the various arrangements according to the disclosure in which two or more capacitors, each having two or more upper capacitor plates disposed over a common node, are formed in a capacitor region in which no further electrical components are situated. Various other arrangements in which two capacitors, each having two or more upper capacitor plates disposed over a common node, i.e., over a common lower capacitor plate, are used in other embodiments in which the capacitors combine to form a differential MOS capacitor. In many embodiments, the upper capacitor electrodes are disposed adjacent one another in a region, i.e., capacitor region 18, that does not include pickup devices or other electrical components within a capacitor region 18. In some embodiments, pickup devices are disposed outside the capacitor region and in other embodiments, a guard ring at least partially surrounds the lower capacitor plate.

FIG. 5 shows another embodiment of a differential MOS capacitor according to the disclosure.

FIG. 5 shows another exemplary arrangement and shows two differential MOS capacitors. Each differential MOS capacitor includes one capacitor 96 having upper capacitor plates 100 and one capacitor 98 having upper capacitor plates 102. Each capacitor 96, 98 is coupled to a gate and a common or dedicated signal source, as in the embodiment illustrated in FIG. 1A. In each case, the upper capacitor plates, 100 or 102 of a particular capacitor are disposed adjacent one another with no other electrical components such as pickup devices 30, between the upper capacitor plates. In the embodiment of FIG. 5, pickup devices 30 are regularly spaced between capacitors 96 and 98 within lower capacitor plate 10. Pickup devices couple lower capacitor plate 10 to ground. In other embodiments, pickup devices 30 are not used and a guard ring such as guard ring 70 is used. In some embodiments, both pickup devices 30 and guard ring 70 are used.

According to one aspect, a differential MOS capacitor semiconductor device is provided. The differential MOS capacitor semiconductor device comprises: a first capacitor section coupled to a first gate and including a plurality of first capacitor upper electrodes coupled to the first gate; a second capacitor section coupled to a second gate and including a plurality of second capacitor upper electrodes coupled to the first gate; a conductive plate that serves as a common bottom capacitor plate for each of the first and second capacitor sections and is formed in or on a substrate surface, wherein the plurality of first capacitor upper electrodes and the plurality of second capacitor upper electrodes are each disposed over the common bottom capacitor plate. In some embodiments, no further electrical components are interposed between the capacitor upper electrodes.

According to another aspect, a differential MOS capacitor semiconductor device is provided. The differential MOS capacitor semiconductor device comprises: a first capacitor section coupled to a first gate and including a plurality of first capacitor upper electrodes; a second capacitor section coupled to a second gate and including a plurality of second capacitor upper electrodes; and a conductive plate that serves as a common bottom capacitor plate for each of the first and second capacitor sections, is disposed in or on a substrate surface, and includes an enclosed capacitor region thereover. The capacitor region includes the plurality of first capacitor upper electrodes and the plurality of second capacitor upper electrodes. In some embodiments, no further electrical components are within the capacitor region.

According to yet another aspect, a differential MOS capacitor semiconductor device is provided. The differential MOS capacitor semiconductor device comprises: a first capacitor section coupled to a first gate and including a plurality of first capacitor upper electrodes disposed over a common bottom capacitor plate; a second capacitor section coupled to a second gate and including a duality of second capacitor upper electrodes disposed over the common bottom capacitor plate; the common bottom capacitor plate comprising a conductive plate disposed in a semiconductor substrate. The first gate is coupled to a first AC signal source; and the second gate is coupled to a second AC signal source. The first signal source delivers first signals that are in phase or out of phase with second signals delivered from the second AC signal source.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A differential MOS capacitor, comprising:
   a first plurality of upper capacitor plates;
   a second plurality of upper capacitor plates, at least two of the second plurality of upper capacitor plates being spaced laterally from each other and being disposed laterally between at least two of the first plurality of upper capacitor plates; and
   a conductive plate configured to serve as a common bottom capacitor plate such that a first capacitor is formed by the first plurality of upper capacitor plates and the conductive plate and a second capacitor is formed by the second plurality of upper capacitor plates and the conductive plate, wherein no electrical components other than the at least two of the second plurality of upper capacitor plates are disposed between the at least two of the first plurality of upper capacitor plates.

2. The differential MOS capacitor of claim 1, wherein the first plurality of upper capacitor plates is coupled to a first gate, and wherein the second plurality of upper capacitor plates is coupled to a second gate.

3. The differential MOS capacitor of claim 1, wherein the first plurality of upper capacitor plates includes a plurality of vertically stacked capacitor plates.

4. The differential MOS capacitor of claim 1, wherein the second plurality of upper capacitor plates include a plurality of vertical stacked capacitor plates.

5. The differential MOS capacitor of claim 1, wherein at least a portion of the first plurality of upper capacitor plates and at least a portion of the second plurality of upper capacitor plates are disposed vertically above the bottom of capacitor plate.

6. A differential MOS capacitor, comprising:
   a first capacitor including a first plurality of upper capacitor plates coupled to a first gate, at least two of the first plurality of upper capacitor plates being laterally spaced from each other;
   a second capacitor including a second plurality of upper capacitor plates coupled to a second gate, at least two of the second plurality of upper capacitor plates being laterally spaced from each other and being disposed laterally between the at least two of the first plurality of upper capacitor plates; and
   a conductive plate configured to serve as a common bottom capacitor plate for each of said first capacitor and the second capacitor, the conductive plate disposed adjacent to an upper surface of a semiconductor substrate,
   wherein at least a portion of the first plurality of upper capacitor plates and at least a portion of the second plurality of upper capacitor plates are disposed vertically above the bottom capacitor plate, wherein no electrical components other than the at least two of the second plurality of upper capacitor plates are disposed between the at least two of the first plurality of upper capacitor plates.

7. The differential MOS capacitor of claim 6, wherein the second plurality of upper capacitor plates includes a plurality of vertical stacked capacitor plates.

8. The differential MOS capacitor of claim 6, further comprising a capacitor dielectric disposed vertically between the first and second pluralities of upper capacitor plates and the bottom capacitor plate.

9. The differential MOS capacitor of claim 6, further comprising at least one pickup device formed over the upper surface of the semiconductor substrate and disposed laterally adjacent to the first plurality of upper capacitor plates.

10. The differential MOS capacitor of claim 9, wherein the at least one pickup device is disposed laterally adjacent to a capacitor region that includes the first capacitor and the second capacitor.

11. A differential MOS capacitor, comprising:
    a semiconductor substrate;
    a well disposed adjacent to an upper surface of the semiconductor substrate;
    a conductive structure disposed in an upper surface of the well;
    a first plurality of upper capacitor plates disposed vertically above the conductive structure; and
    a second plurality of upper capacitor plates disposed vertically above the conductive structure,
    wherein at least two of the second plurality of upper capacitor plates are disposed between at least two of the first plurality of upper capacitor plates,
    wherein the conductive structure and the first plurality of upper capacitor plates form a first capacitor, and
    wherein the conductive structure and the second plurality of upper capacitor plates form a second capacitor, and wherein no electrical components other than the at least two of the second plurality of upper capacitor plates are disposed between the at least two of the first plurality of upper capacitor plates.

12. The differential MOS capacitor of claim 11, wherein the first plurality of upper capacitor plates is coupled to a first gate.

13. The differential MOS capacitor of claim 12, wherein the second plurality of upper capacitor plates is coupled to a second gate.

* * * * *